United States Patent
Nentwig et al.

(10) Patent No.: US 8,725,092 B2
(45) Date of Patent: May 13, 2014

(54) METHODS AND APPARATUSES FOR FREQUENCY FILTERING FOR NON-CENTERED COMPONENT CARRIER TRANSMISSION

(75) Inventors: Markus Nentwig, Helsinki (FI); Risto Ilari Wichman, Helsinki (FI)

(73) Assignee: Nokia Corporation, Espoo (FI)

( * ) Notice: Subject to any disclaimer, the term of this patent is extended or adjusted under 35 U.S.C. 154(b) by 1051 days.

(21) Appl. No.: 12/616,448

(22) Filed: Nov. 11, 2009

(65) Prior Publication Data

US 2011/0111710 A1    May 12, 2011

(51) Int. Cl.
*H01Q 11/12* (2006.01)
*H04B 1/04* (2006.01)
*H04B 15/00* (2006.01)

(52) U.S. Cl.
USPC ........ 455/119; 455/147; 455/196.1; 455/208; 455/255; 455/258; 375/148

(58) Field of Classification Search
USPC ............ 455/119, 296, 304–307, 75, 76, 455/85–86.91, 102–104, 109, 112–113, 455/116, 123, 266, 151.3, 196.1, 147, 208, 455/255, 258–259, 265; 375/148, 285, 346, 375/350, 144, 348
See application file for complete search history.

(56) References Cited

U.S. PATENT DOCUMENTS

| | | | | |
|---|---|---|---|---|
| 6,005,894 | A * | 12/1999 | Kumar | 375/270 |
| 6,219,376 | B1 * | 4/2001 | Zhodzishsky et al. | 375/148 |
| 6,697,603 | B1 * | 2/2004 | Lovinggood et al. | 455/13.1 |
| 7,301,377 | B2 * | 11/2007 | Tanaka et al. | 327/113 |
| 7,680,236 | B1 * | 3/2010 | Melanson et al. | 375/376 |
| 7,817,734 | B2 * | 10/2010 | Subramanyam et al. | 375/260 |
| 7,961,818 | B2 * | 6/2011 | Feller | 375/326 |
| 8,223,861 | B2 * | 7/2012 | Shiue et al. | 375/260 |
| 2009/0180520 | A1 * | 7/2009 | Kobayashi | 375/147 |
| 2011/0181463 | A1 * | 7/2011 | Chopard et al. | 342/357.26 |
| 2012/0050103 | A1 * | 3/2012 | Revol | 342/357.68 |

* cited by examiner

*Primary Examiner* — Pablo Tran (74) *Attorney, Agent, or Firm* — Harrington & Smith (57) ABSTRACT

In accordance with an example embodiment of the present invention, an apparatus comprises a first multiplier configured to convert a first frequency signal into a second frequency signal based at least in part on a first complex-valued local oscillator signal, a pair of low-pass filters configured to filter the second frequency signal, and a second multiplier configured to convert the filtered second frequency signal into a third frequency signal based at least in part on a second complex-valued local oscillator signal wherein the first frequency signal and the third frequency signal share the same frequency position and the pair of low-pass filters is configured based on an indication of allocated transmitted channels.

18 Claims, 5 Drawing Sheets

METHODS AND APPARATUSES FOR FREQUENCY FILTERING FOR NON-CENTERED COMPONENT CARRIER TRANSMISSION

TECHNICAL FIELD

The present application relates generally to method and apparatuses for frequency filtering for non-centered component carrier transmission.

BACKGROUND

Wireless systems such as the long term evolution-advanced (LTE-A) may use multiple spectrum segments, also termed "component carriers" to accommodate flexible bandwidth requirements. Each segment may have a fixed or configurable frequency spectrum width, such as 20 MHz. While one segment may be permanently allocated for an LTE-A base station known as evolution Node B (eNodeB), thus termed "primary component carrier", others may be shared with nearby base stations, depending on resource availability, traffic volume, the number of user equipments (UEs) served by each eNodeB and the like.

Normal baseband signal generation of an orthogonal frequency-division multiplexing (OFDM) signal that occupies a single component carrier as used in a LTE-A downlink may need spectrum shaping filtering to rid of unwanted out-of-band emissions. This is because a discontinuity often occurs between the waveforms of an OFDM symbol and the cyclic prefix of the next adjacent OFDM symbol. The discontinuity causes undesired spectral leakage into nearby frequency bands that may need to be suppressed by filtering.

Filtering such as spectrum shaping filtering may be performed by at least one digital filter operating on a digital complex baseband signal that comprises a real part and an imaginary part. For a single component carrier transmission, the frequency response of the filtering operation may be symmetrical relative to the frequency of 0 Hz. A digital filter having a symmetric frequency response can be implemented using a real-valued filter operating on the real part of the signal, and another real-valued filter operating on the imaginary part of the signal.

SUMMARY

Various aspects of examples of the invention are set out in the claims.

According to a first aspect of the present invention, an apparatus comprises a first multiplier configured to convert a first frequency signal into a second frequency signal based at least in part on a first complex-valued local oscillator signal, a pair of low-pass filters configured to filter the second frequency signal, and a second multiplier configured to convert the filtered second frequency signal into a third frequency signal based at least in part on a second complex-valued local oscillator signal wherein the first frequency signal and the third frequency signal share the same frequency position and the pair of low-pass filters is configured based on an indication of allocated transmitted channels.

According to a second aspect of the present invention, a method comprises converting a first frequency signal into a second frequency signal based at least in part on a first complex-valued local oscillator signal, filtering the second frequency signal, and converting the filtered second frequency signal into a third frequency signal based at least in part on a second complex-valued local oscillator signal wherein the third frequency signal shares a same frequency position and a center frequency as the first frequency signal; and the first complex-valued local oscillator signal and the second complex-valued local oscillator signal indicate allocations of transmitted channels.

According to a third aspect of the present invention, an apparatus comprises at least one processor and at least one memory including computer program code. The at least one memory and the computer program code, with the at least one processor, cause the apparatus to convert a first frequency signal into a second frequency signal based at least in part on a first complex-valued local oscillator signal, filter the second frequency signal, and convert the filtered second frequency signal into a third frequency signal based at least in part on a second complex-valued local oscillator signal wherein the third frequency signal shares a same center frequency and a frequency position as the first frequency signal; and the first complex-valued local oscillator signal and the second complex-valued local oscillator signal indicate allocations of transmitted channels.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE DRAWINGS

When additional component carriers are used, the spectrum of the baseband signal may become asymmetric relative to the center frequency of the primary component carrier. Also the frequency response required to limit unwanted out-of-band emissions to a tolerable level may become asymmetric. Such an asymmetric frequency response may require a complex-valued filter operating on complex-valued signals rather than two real-valued filters operating on real-valued signals. This solution may be undesirable, because it increases cost and power consumption of the filter. An example embodiment of the invention discloses a filtering apparatus for multiple non-centered component carriers that includes low-pass filters, coupled to multipliers and local oscillator signals. The filtering apparatus is low-cost and scalable to multiple segments.

An example embodiment of the present invention and its potential advantages are understood by referring to FIGS. 1 through 5 of the drawings.

Figure 1:
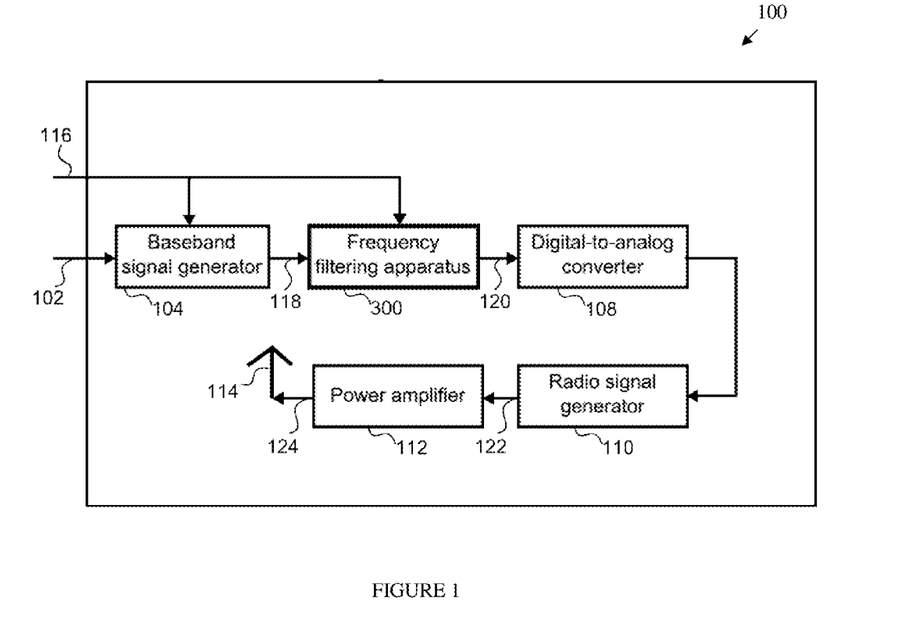
FIG. 1 illustrates an example radio transmitting apparatus.

FIG. 1 illustrates an example radio transmitting apparatus 100. The radio transmitting apparatus 100 includes a baseband signal generator 104, a frequency filtering apparatus 300, a digital-to-analog converter 108, a radio signal generator 110, a power amplifier 112 and a transmitting antenna 114.

In one example embodiment, an LTE-A eNodeB base station may allocate a new component carrier in addition to the primary component carrier to a user equipment to accommodate traffic from an additional application such as a voice call in addition to the traffic from an in-progress web browsing session. The data of the two applications all in the form of data packets are to be sent over the primary component carrier and a flexibly allocated component carrier via the radio transmitting apparatus 100 which may be part of an LTE-A eNodeB. Information from the data packets flows through several processing layers of the eNodeB, resulting in a digital signal 102 that is provided to the radio transmitting apparatus 100.

In an example embodiment, the eNodeB may continuously negotiate radio resource allocations with nearby eNodeBs. Depending on environmental parameters such as demands on traffic, the number of served UEs and the availability of radio resources, the number of component carriers that is available to an eNodeB may vary. Radio resource negotiation may be performed by a resource control module. A resource control module may provide the current radio resource allocation status to the radio transmitting apparatus 100 using an allocation control signal 116.

The baseband signal generator 104 may generate a digital baseband signal 118 based on a digital input signal 102. The baseband signal generator 104 may map information from the digital input signal 102 to frequency components allocated for transmission, such as subcarriers, in the digital baseband signal 118. The baseband signal generator 104 may receive configuration information through the allocation control signal 116 to utilize frequency regions that correspond to the component carriers currently allocated by the radio resource control module. The output signal of baseband signal generator 104 may include unwanted emissions on frequency components not allocated for transmissions, caused for example by discontinuities between adjacent symbols resulting from an OFDM signal generation process.

The frequency filtering apparatus 300 may take digital baseband signal 118 as input signal, and generate a filtered digital signal 120 as its output. Details of the frequency filtering apparatus 300 for non-centered component carriers may be found in FIG. 3 and are described hereinafter. The filtered digital signal 120 may comprise a real part and an imaginary part. Filtered digital signal 120 may be provided to the digital-to-analog converter 108 that may convert the filtered digital signal into one or more analog signals. The digital-to-analog converter 108 may convert an abstract finite-precision number such as a fixed-point binary number into an analog output signal described by a concrete physical quantity such as an electrical voltage or current. In particular, the digital-to-analog converter 108 may be used to convert finite-precision time series data to a continually-varying physical signal. The analog-to-digital converter 108 may generate a first time-continuous analog signal based on a real part of the filtered digital signal 120, and a second time-continuous analog signal based on an imaginary part of the filtered digital signal 120.

In one example embodiment, the radio signal generator 110 may generate radio signals from the time-continuous analog signals. The radio signal generator may modulate a radio frequency carrier wave with a time-continuous analog signal in amplitude and phase. The radio signal generator may modulate a sine component of a carrier wave using a first time-continuous analog signal, and a cosine component of the carrier wave using a second time-continuous analog signal. A generated radio frequency signal 122 may be in a frequency range that is compliant with the LTE-A frequency spectrum, such as the frequency spectrum 1930 MHz to 1990 MHz in US.

In one example embodiment, the radio frequency signal 122 generated by the radio signal generator 110 is input to the power amplifier 112. The power amplifier 112 may increase the amplitude of the radio frequency signal 122, and generate an amplified radio frequency signal 124. The amplified radio frequency signal 124 may be transmitted over a wireless medium by the transmit antenna 114.

In one example embodiment, the radio transmitting apparatus 100 is part of an eNodeB employing multiple-antenna techniques (MIMO). The eNodeB may contain a first radio transmitting apparatus 100, connected to a first transmit antenna. The first radio transmitting apparatus may receive a digital input signal that may correspond to a first MIMO stream to be transmitted over the first antenna. Furthermore, the eNodeB may contain a second radio transmitting apparatus. The second radio transmitting apparatus may be a replica of the first radio transmitting apparatus. The second radio transmitting apparatus may be connected to a second transmit antenna, and may receive a digital input signal that may correspond to a second MIMO stream to be transmitted over the second transmit antenna.

Figure 2:
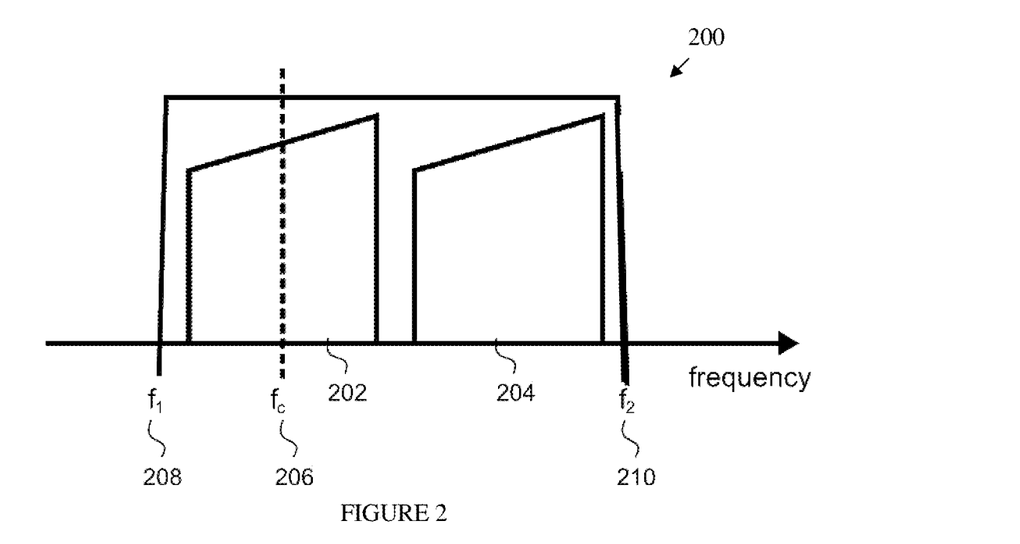
FIG. 2 illustrates example component carriers that are non-centered relative to a center frequency $f_c$.

FIG. 2 illustrates a spectrum of a transmit signal with non-centered component carriers. In one example embodiment, the transmit signal with non-centered component carriers may be generated by an LTE-A eNodeB. The LTE-A eNodeB may allocate a primary component carrier 202 and an additional secondary component carrier 204. In order to accommodate the bandwidth of the secondary component carrier 204, the frequency response of a spectrum shaping filter such as the frequency filtering apparatus 300 may extend asymmetrically towards positive frequencies towards the right side of the frequency axis of FIG. 2. The frequency filtering apparatus 300, described hereinafter, may be configured to provide such filter frequency response. Frequency $f_c$ may correspond to a frequency of a radio frequency carrier wave that is modulated by a complex baseband form of a transmit signal.

In one example embodiment, a first frequency 208 is shown on the frequency axis as $f_1$. The first frequency 208 may indicate a first corner of a spectral emission mask. The transmitting apparatus 100 of FIG. 1 may be used to keep unwanted power emission under the limits below the first frequency 208. The baseband signal generator 104 may generate the signal 118 that exceeds emission limits below the first frequency 208. A second frequency 210 is shown on the frequency axis as $f_2$ that may indicate a second corner of a spectral emission mask. The transmitting apparatus 100 may be used to keep unwanted power emission under limits above the second frequency 210. The baseband signal generator 104 may generate the signal 118 that exceeds the emission limit above the second frequency 210.

Additionally, a center frequency 206 is also shown on the frequency axis as $f_c$. The center frequency 206 may correspond to a local oscillator signal within the radio signal generator 110 in FIG. 1. The center frequency 206 may correspond to a frequency of 0 Hz in digital baseband signal 118. The center frequency 206 may be located arbitrarily on the frequency axis, relative to the first frequency 208 and the second frequency 210.

The first frequency 208 and the second frequency 210 may correspond to corners on a spectral emission mask that may apply to a predetermined configuration of component carriers. For example, a transmission taking place in one component carrier may meet a narrower spectral emission mask than another transmission occupying several component carriers. Transmitted channels may be restricted to allocated component carriers. For example, a component carrier may contain one or more transmitted channel. A transmitted channel may be permitted to extend over more than one allocated component carrier. However, transmitted channels may not extend into frequency regions belonging to non-allocated component carriers. Thus, the first frequency 208 and the second frequency 210 may indicate allocations of the transmitted channels.

Figure 2A:
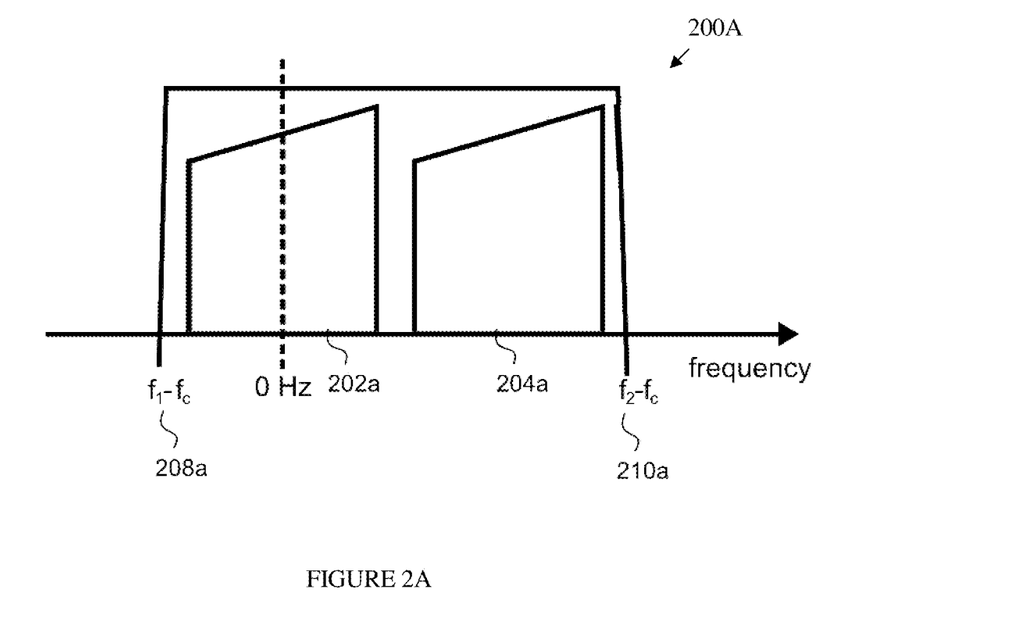
FIG. 2A illustrates an example complex baseband representation of a transmit signal with non-centered component carriers.

FIG. 2A illustrates an example complex baseband representation 200A of a transmit signal with non-centered component carriers. The complex baseband representation 200A may be a complex-baseband equivalent of the spectrum of the transmit signal 200. Baseband component carriers 202a and 204a may be the complex-baseband equivalent representations of the component carriers 202 and 204, respectively. The frequency baseband representation 200A may be generated by the baseband signal generator 104 of FIG. 1. The transmit signal 200 may result from providing the example complex baseband representation 200A to the radio signal generator 110 of FIG. 1. A modified first frequency 208a may indicate a first corner of a spectral emission mask, relative to a carrier frequency. A modified second frequency 210a may indicate a second corner of a spectral emission mask, relative to a carrier frequency.

Figure 3:
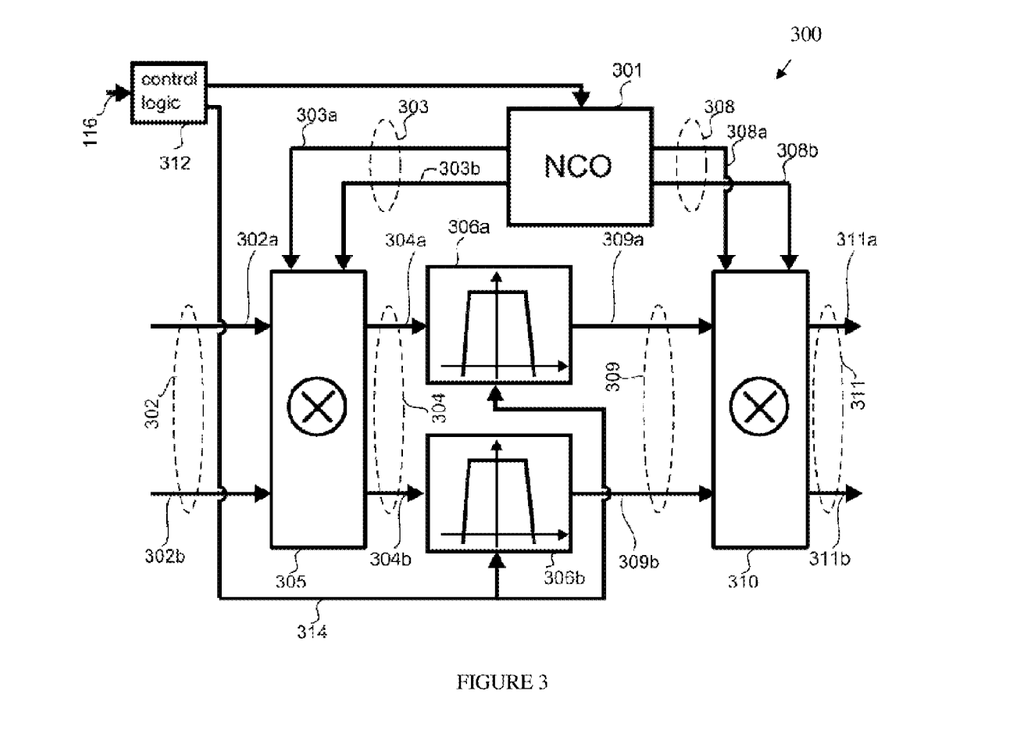
FIG. 3 illustrates an example filtering apparatus for non-centered component carriers.

FIG. 3 illustrates an example embodiment of frequency filtering apparatus 300 for non-centered component carriers. The frequency filtering apparatus 300 includes a control logic 312, a numerically-controlled oscillator (NCO) 301, a first complex-valued multiplier 305, a first real-valued filter 306a, a second real-valued filter 306b and a second complex-valued multiplier 310.

The frequency filtering apparatus 300 may receive a complex-valued baseband signal 302, which may be provided by the baseband signal generator 104 of FIG. 1. The complex-valued baseband signal 302 may comprise a real part 302a and an imaginary part 302b.

The numerically-controlled oscillator 301 may generate a first complex-valued local oscillator signal 303, comprising a real part 303a and an imaginary part 303b. Further, the numerically-controlled oscillator 301 may generate a second complex-valued local oscillator signal 308, comprising a real part 308a and an imaginary part 308b. The first complex-valued local oscillator signal 303 and the second complex-valued local oscillator signal 308 may have a constant amplitude and a phase that is linear with time. The first multiplier 305 may calculate a complex-valued product of the complex-valued input signal 302 and the first complex-valued local oscillator signal 303. The result may be a second complex-valued frequency signal 304, comprising a real part 304a and a real part 304b.

The first filter 306a may operate on the real part 304a of the second complex-valued frequency signal 304, producing a first real-valued signal 309a. The second filter 306b may operate on the imaginary part 304b of the second complex-valued frequency signal 304, producing a second real-valued signal 309b. The first real-valued signal 309a and the second real-valued signal 309b may be combined into a second filtered complex-valued frequency signal 309, representing a real part and an imaginary part of the complex-valued signal 309 respectively. The filters 306a and 306b may act as low-pass filters which each may have a frequency response that rejects signals at frequencies above a cutoff frequency $f_{LP}$. A low-pass filter may be obtained by configuring a general-purpose filter such as a finite-impulse-response (FIR) filter with a set of coefficients suitable to provide a low-pass frequency response. The filters 306a and 306b may also act as band-pass filters which may reject frequencies that fall outside a passband. A band-pass filter may have more than one passband.

In one example embodiment, the control logic 312 may receive a control signal 116. The control signal 116 may indicate an allocation of radio resources. The control signal 116 may be provided by a radio resource control module of an eNodeB. The control signal 116 may include a first frequency limit $f_1$ which may indicate a corner of a spectral emission mask, corresponding to the first frequency 208 of FIG. 2. The control signal 116 may also include a second frequency $f_2$ which may indicate another corner of a spectral emission mask, corresponding to the second frequency 210 of FIG. 2. The control signal 116 may include a center frequency $f_c$ which may correspond to the center frequency 206 of FIG. 2. The control signal 116 may include a modified first frequency, which may indicate a difference between the first frequency limit $f_1$ and the center frequency $f_c$. The control signal 116 may include a modified second frequency, which may indicate a difference between the second frequency $f_2$ and the center frequency $f_c$.

In one embodiment, the control logic 312 may configure a frequency response of at least one of the first filter 306a and the second filter 306b using a filter control signal 314. The filter control signal 314 may include an index to select one of a set of predetermined frequency responses stored in the frequency filtering apparatus 300 for non-centered component carriers. The filter control signal 314 may include a set of finite impulse response (FIR) filter coefficients.

In one embodiment, the control logic 312 may compute a bandwidth BW as a difference between the first frequency limit $f_1$ and the second frequency limit $f_2$ from the control signal 116 according to the equation $BW=f_2-f_1$. The control logic 312 may configure at least one of the first filter 306a and the second filter 306b to a low-pass frequency response with a bandwidth of BW/2. The control logic 312 may compute a frequency offset $f_o(f_1+f_2)/2-fc$. The control logic 312 may configure the numerically-controlled oscillator 301 to generate the first complex-valued local oscillator signal 303 at a first local oscillator frequency $f_{LO,1}=f_o$ and the second complex-valued local oscillator signal 308 at a second local oscillator frequency $f_{LO,2}=f_o$. The first complex-valued local oscillator (LO) signal 303 may be generated by the numerically-controlled oscillator 301 according to the equation $LO_1(t)=\exp(i\,2\pi f_{LO,1}\,t)$, where $\exp(x)$ is an exponential function, i is the imaginary unit $i=\sqrt{-1}$, and t is time. The second complex-valued oscillator signal 308 may be generated by the numerically-controlled oscillator 301 according to the equation $LO_2(t)=\exp(i\,2\pi f_{LO,2}\,t)$.

Techniques for generating complex-valued oscillator signals $LO_1(t)$ and $LO_2(t)$ may include but are not limited to phase accumulators, lookup tables or a coordinate rotation digital computer (CORDIC) algorithm. In one embodiment, one of the first and second complex-valued local oscillator signals is generated by applying a mapping function $f(x)$ to the other complex-valued local oscillator signal. The mapping function $f(x)$ may use the expression $f(x)=a\,\text{conj}(b\,x)$, where a and b are predetermined complex- or real-valued constants, and $\text{conj}(\ldots)$ denotes complex conjugation function. One or both of constants a and b may be 1.

Figure 5:
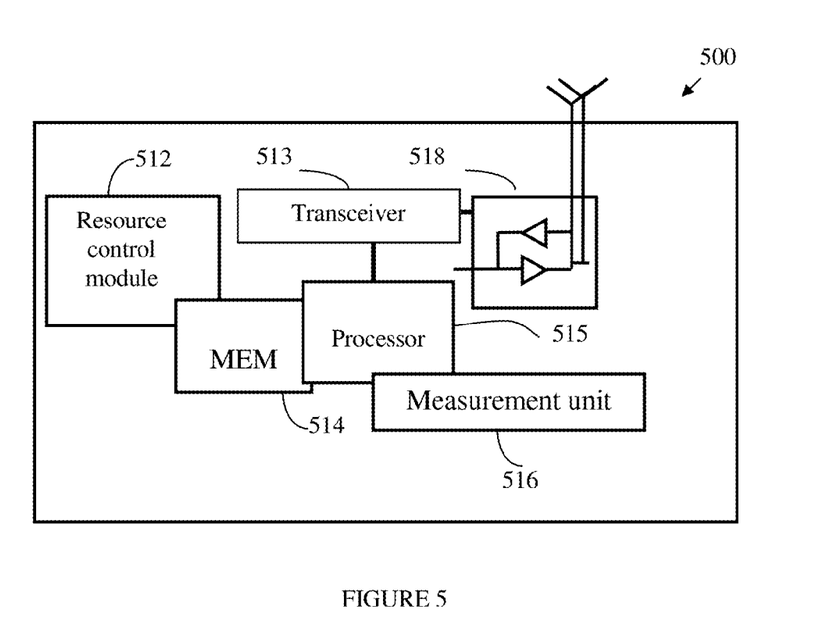
FIG. 5 illustrates an example wireless apparatus.

In one example embodiment, the frequency filtering apparatus 300 may be implemented in the transceiver 513 of FIG. 5, as illustrated and described shortly. The filtering apparatus 300 may be at least part of one of a radio transmitter, a long-term-evolution-advanced (LTE-A) base station, and a LTE-A user equipment. The frequency filtering apparatus 300 is for illustration purpose and may be extended to accommodate multiple non-centered carrier components with multiple input signals and multiple output signals, without departing from the scope of the invention of this example embodiment.

Figure 4:
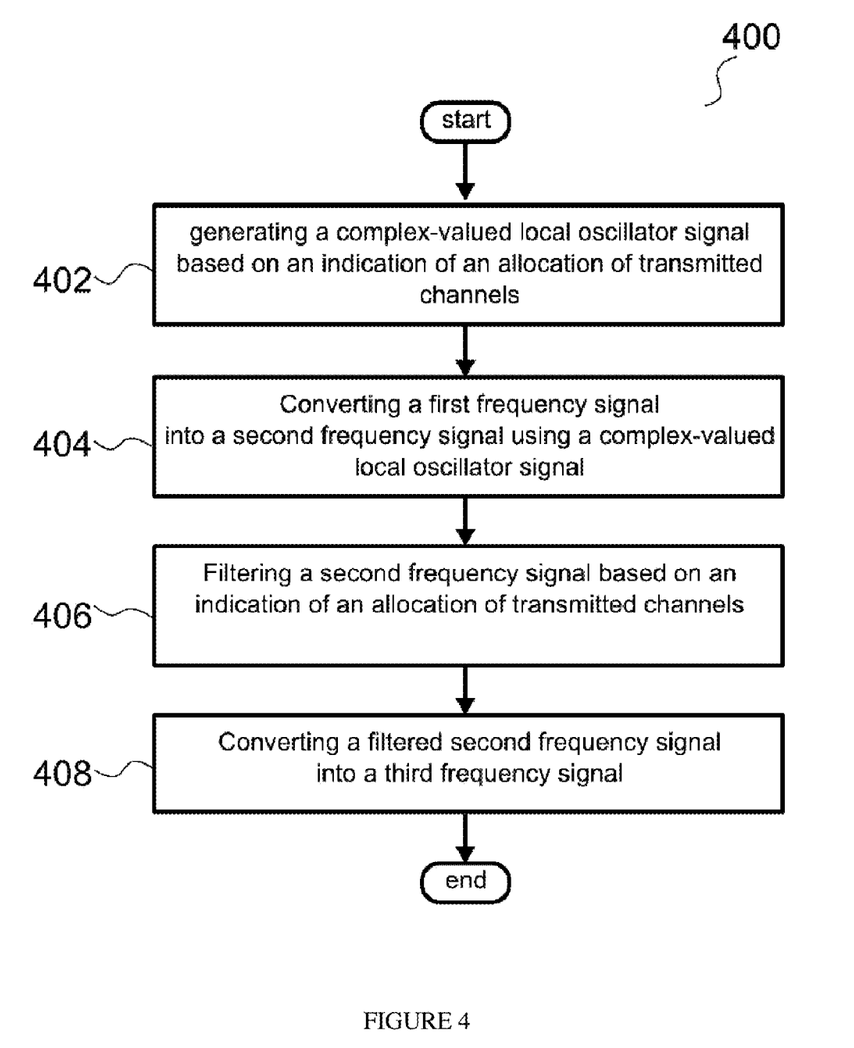
FIG. 4 illustrates an example method for frequency filtering for non-centered carrier components.

FIG. 4 illustrates an example method 400 for frequency filtering for non-centered carrier components. The method 400 may include generating a complex-valued local oscillator signal at block 402 based on an indication of an allocation of transmitted channels, converting a first frequency signal to a second frequency signal at block 404, filtering the second frequency signal at block 406, and converting the filtered second frequency signal to a third frequency signal at block 408.

Generating the complex-valued local oscillator signal at block 402 based on the allocation of transmitted channels may include determining an average between at least two corner frequencies of a spectral emission mask. Generating the complex-valued local oscillator signal at block 402 may also include configuring a source of local oscillator signals to a frequency depending on the determined average.

Converting the first frequency signal to the second frequency signal at block 404 may include multiplying a first complex-valued frequency signal with a complex-valued local oscillator signal. Multiplying the first complex-valued frequency signal with the complex-valued local oscillator signal may further include calculating a real part of the second frequency signal as a first product of the first complex-valued frequency signal and the complex-valued local oscillator signal. Multiplying the first complex-valued frequency signal with a complex-valued local oscillator signal may also include calculating an imaginary part of the second frequency signal as a second product of the first complex-valued frequency signal and the complex-valued local oscillator signal.

Filtering the second frequency signal at block 406 may include filtering the second frequency signal based on an indication of the allocation of transmitted channels. Filtering the second frequency signal based on the indication of an allocation of transmitted channels may further include determining a bandwidth corresponding to the allocation of transmitted channels, configuring at least one filter to a low-pass frequency response with a bandwidth proportional to the determined bandwidth, and applying the configured filter to at least one real-valued component of the second frequency signal.

Converting the filtered second frequency signal to the third frequency signal at block 408 may include generating a second local oscillator signal and performing a complex multiplication between the second local oscillator signal and the filtered second frequency signal to produce the third frequency signal. The first frequency signal and the third frequency signal share the same frequency position and center frequency.

In an example embodiment, the method 400 may be implemented in the frequency filtering apparatus 300 of FIG. 1 and FIG. 3. The method 400 is for illustration only and the steps of the method 400 may be combined, divided, or arranged in a different order than illustrated, without departing from the scope of the invention of this example embodiment.

FIG. 5 is a block diagram illustrating an example wireless apparatus 500 including a filtering apparatus for non-centered component carriers in accordance with an example embodiment of the invention. In FIG. 5, the wireless apparatus 500 may include a processor 515, a memory 514 coupled to the processor 515, and a suitable transceiver 513 (having a transmitter (TX) and a receiver (RX)) coupled to the processor 515, coupled to an antenna unit 518. The memory 514 may store programs such as a radio resource control module 512. The wireless apparatus 500 may be at least part of a $4^{th}$ generation mobile station, a LTE-A compliant mobile station and a LTE-A compliant base station.

The processor 515 or some other form of generic central processing unit (CPU) or special-purpose processor such as digital signal processor (DSP), may operate to control the various components of the wireless apparatus 500 in accordance with embedded software or firmware stored in memory 514 or stored in memory contained within the processor 515 itself. In addition to the embedded software or firmware, the processor 515 may execute other applications or application modules stored in the memory 514 or made available via wireless network communications. The application software may comprise a compiled set of machine-readable instructions that configures the processor 515 to provide the desired functionality, or the application software may be high-level software instructions to be processed by an interpreter or compiler to indirectly configure the processor 515. In an example embodiment, the resource control module 512 may be configured to allocate one or more additional component carriers to a user equipment when a need arises and the resources are available in collaboration with other modules such as the transceiver 513.

The transceiver 513 is for bidirectional wireless communications with another wireless device. The transceiver 513 may provide frequency shifting, converting received RF signals to baseband and converting baseband transmit signals to RF, for example. In some descriptions a radio transceiver or RF transceiver may be understood to include other signal processing functionality such as modulation/demodulation, coding/decoding, interleaving/deinterleaving, spreading/despreading, inverse fast fourier transforming (IFFT)/fast fourier transforming (FFT), cyclic prefix appending/removal, and other signal processing functions. In some embodiments, the transceiver 513, portions of the antenna unit 518, and an analog baseband processing unit may be combined in one or more processing units and/or application specific integrated circuits (ASICs). Parts of the transceiver may be implemented in a field-programmable gate array (FPGA) or reprogrammable software-defined radio.

In one example embodiment, the transceiver 513 may include a filtering apparatus for non-centered component carriers such as the filtering apparatus 300. As such, the filtering apparatus may include a processor of its own and at least one memory including computer program code. The at least one memory and the computer program code configured to, with the processor, cause the filtering apparatus to perform at least the following: converting a first frequency signal into a second frequency signal based at least in part on a first complex-valued local oscillator signal; filtering the second frequency signal; and converting the filtered second frequency signal into a third frequency signal based at least in part on a second complex-valued local oscillator signal wherein the third frequency signal shares a frequency position with the first frequency signal and the first complex-valued local oscillator signal and the second complex-valued local oscillator signal indicate allocations of transmitted channels.

The antenna unit 518 may be provided to convert between wireless signals and electrical signals, enabling the wireless apparatus 500 to send and receive information from a cellular network or some other available wireless communications network or from a peer wireless device. In an embodiment, the antenna unit 518 may include multiple antennas to support beam forming and/or multiple input multiple output (MIMO) operations. As is known to those skilled in the art, MIMO operations may provide spatial diversity and multiple parallel channels which can be used to overcome difficult channel conditions and/or increase channel throughput. The antenna unit 518 may include antenna tuning and/or impedance matching components, RF power amplifiers, and/or low noise amplifiers.

As shown in FIG. 5, the wireless apparatus 500 may further include a measurement unit 516, which measures the signal strength level that is received from another wireless device, and compare the measurements with a configured threshold. The measurement unit may be utilized by the wireless apparatus 500 in conjunction with various exemplary embodiments of the invention, as described herein.

In general, the various exemplary embodiments of the wireless apparatus 500 may include, but are not limited to, part of a user equipment, or a wireless device such as a portable computer having wireless communication capabilities, Internet appliances permitting wireless Internet access and browsing, as well as portable units or terminals that incorporate combinations of such functions.

Without in any way limiting the scope, interpretation, or application of the claims appearing below, a technical effect of one or more of the example embodiments disclosed herein is to enable frequency filtering for multiple non-centered component carriers to support flexible frequency allocations of LTE-A networks. Another technical effect of one or more of the example embodiments disclosed herein is a low cost solution to the frequency filtering for non-centered component carriers because low cost low-pass filters and multipliers may be used to accomplish the frequency filtering for non-centered component carriers. Another technical effect of one or more of the example embodiments disclosed herein is the scalability of the solution, which may be scaled to accommodate multiple component carriers.

Embodiments of the present invention may be implemented in software, hardware, application logic or a combination of software, hardware and application logic. The software, application logic and/or hardware may reside on a user equipment, a base station or an access point. If desired, part of the software, application logic and/or hardware may reside on access point, part of the software, application logic and/or hardware may reside on a network element such as a UE, and part of the software, application logic and/or hardware may reside on a peer network element such as a base station or an access point. In an example embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted in FIG. 5. A computer-readable medium may comprise a computer-readable storage medium that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. An apparatus, comprising
a controller for receiving a control signal and indicating an allocation of transmitted channels dependent on the control signal, wherein the allocation of transmitted channels includes multiple non-centered component carriers usable for flexible frequency allocation in an orthogonal frequency-division multiplexing wireless communication signal;
a first multiplier configured to convert a first frequency signal into a second frequency signal based at least in part on a first complex-valued local oscillator signal;
a pair of low-pass filters controlled by the controller to filter the second frequency signal;
a second multiplier configured to convert the filtered second frequency signal into a third frequency signal based at least in part on a second complex-valued local oscillator signal wherein the first frequency signal and the third frequency signal share a frequency position and wherein the pair of low-pass filters is controlled based on the indication of the allocated transmitted channels that include the multiple non-centered component carriers usable for flexible frequency allocation in the orthogonal frequency-division multiplexing wireless communication signal; and
a numerically-controlled oscillator controlled by the controller based at least in part on the indication of the allocated transmitted channels, to create the first and second complex-valued local oscillator signal, and wherein one of the first complex-valued local oscillator signal and the second complex-valued local oscillator signal is a complex conjugate of the other complex-valued local oscillator signal.

2. The apparatus of claim 1 wherein the indication of the allocated transmit channels comprises information on a bandwidth allocated for transmission and the center frequency allocated for the transmission.

3. The apparatus of claim 1 wherein the numerically-controlled oscillator generates a complex-valued signal with a constant amplitude and a phase that is linear with time.

4. The apparatus of claim 1 wherein at least one of the pair of low-pass filters comprises one finite impulse response filter.

5. The apparatus of claim 1 wherein the pair of low-pass filters comprises
a first filter configured to take a real component of the second frequency signal as an input; and
a second filter configured to take an imaginary component of the second frequency signal as a second input;
wherein the first filter and the second filter collectively produce the filtered second frequency signal from the real component and the imaginary component of the second frequency signal based at least in part on a set of real-valued coefficients.

6. The apparatus of claim 5 wherein the first filter and the second filter are configured to use the set of real-valued coefficients.

7. The apparatus of claim 1 wherein the first frequency signal is one of a baseband frequency and an intermediate frequency signal.

8. The apparatus of claim 1 wherein the apparatus is at least part of one of a radio transmitter, a long-term-evolution-advanced (LTE-A) base station, and a LTE-A user equipment.

9. The apparatus of claim 1 wherein the control signal includes an index to select one of a set of predetermined frequency responses for non-centered component carriers.

10. The apparatus of claim 1 wherein the control signal includes a set of finite impulse response filter coefficients.

11. A method, comprising:
receiving a control signal;
indicting an allocation of transmitted channels dependent on the control signal, wherein the allocation of transmitted channels includes multiple non-centered component carriers usable for flexible frequency allocation in an orthogonal frequency-division multiplexing wireless communication signal;
converting a first frequency signal into a second frequency signal based at least in part on a first complex-valued local oscillator signal;
filtering the second frequency signal; and
converting the filtered second frequency signal into a third frequency signal based at least in part on a second complex-valued local oscillator signal wherein the third frequency signal shares a same frequency position as the first frequency signal, wherein the first complex-valued local oscillator signal and the second complex-valued local oscillator signal indicate the allocations of the transmitted channels that include the multiple non-centered component carriers usable for flexible frequency allocation in the orthogonal frequency-division multiplexing wireless communication signal, and wherein one of the first complex-valued local oscillator signal and the second complex-valued local oscillator signal is a complex conjugate of the other complex-valued local oscillator signal.

12. The method of claim 11, further comprising generating the first complex-valued local oscillator signal and the second complex-valued local oscillator signal using a numerically-controlled oscillator.

13. The method of claim 11 wherein converting the first frequency signal into the second frequency signal further comprises multiplying the first frequency signal with the first complex-valued local oscillator signal to produce the second frequency signal.

14. The method of claim 11 wherein converting the filtered second frequency signal into the third frequency signal further comprises multiplying the filtered second frequency signal with the second complex-valued local oscillator signal to produce the third frequency signal.

15. The method of claim 11 wherein one of the first complex-valued local oscillator signal and the second complex-valued local oscillator signal is a conjugate of the other complex-valued oscillator signal.

16. The method of claim 11 wherein filtering the second frequency signal further comprises filtering a real component of the second frequency signal using a first low-pass filter configured using a set of real-valued coefficients, filtering an imaginary component of the second frequency signal using a second low-pass filter configured using a second set of real-valued coefficients, and combining the filtered real component and the filtered imaginary component of the second frequency signal to produce the filtered second frequency signal.

17. The method of claim 11 wherein the first frequency signal is one of a baseband frequency and an intermediate frequency signal.

18. An apparatus, comprising:
at least one processor; and
at least one memory including computer program code
the at least one memory and the computer program code configured to, with the at least one processor, cause the apparatus to perform at least the following:
receiving a control signal;
indicating an allocation of transmitted channels dependent on the control signal, wherein the allocation of transmitted channels includes multiple non-centered component carriers usable for flexible frequency allocation in an orthogonal frequency-division multiplexing wireless communication signal;
converting a first frequency signal into a second frequency signal based at least in part on a first complex-valued local oscillator signal;
filtering the second frequency signal; and
converting the filtered second frequency signal into a third frequency signal based at least in part on a second complex-valued local oscillator signal wherein the third frequency signal shares a same a frequency position as the first frequency signal, wherein the first complex-valued local oscillator signal and the second complex-valued local oscillator signal indicate the allocations of the transmitted channels that include the multiple non-centered component carriers usable for flexible frequency allocation in the orthogonal frequency-division multiplexing wireless communication signal, and wherein one of the first complex-valued local oscillator signal and the second complex-valued local oscillator signal is a complex conjugate of the other complex-valued local oscillator signal.

* * * * *